United States Patent
Lien et al.

(10) Patent No.: US 7,537,982 B2
(45) Date of Patent: May 26, 2009

(54) METHOD AND STRUCTURE FOR ISOLATING SUBSTRATE NOISE

(75) Inventors: Wai-Yi Lien, Hsin-Chu (TW); Denny Duan-lee Tang, Saratoga, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/972,482

(22) Filed: Jan. 10, 2008

(65) Prior Publication Data

US 2008/0132028 A1    Jun. 5, 2008

Related U.S. Application Data

(62) Division of application No. 11/089,186, filed on Mar. 24, 2005, now Pat. No. 7,492,018.

(60) Provisional application No. 60/611,186, filed on Sep. 17, 2004.

(51) Int. Cl.
*H01L 21/00* (2006.01)
*H01L 21/76* (2006.01)
(52) U.S. Cl. ...................... 438/154; 438/454
(58) Field of Classification Search ............... 438/140, 438/454, 570; 257/170, 409, 483, 484, 490, 257/493–495, E29.012, E23.013
See application file for complete search history.

(56) References Cited

U.S. PATENT DOCUMENTS

| | | | |
|---|---|---|---|
| 4,646,115 A | 2/1987 | Shannon et al. | |
| 4,987,087 A | 1/1991 | Voss | |
| 5,241,210 A | 8/1993 | Nakagawa et al. | |
| 6,214,750 B1 | 4/2001 | Liao | |
| 6,429,501 B1 * | 8/2002 | Tsuchitani et al. | 257/493 |
| 6,459,134 B2 | 10/2002 | Ohguro et al. | |
| 6,800,918 B2 | 10/2004 | Pon | |
| 6,825,105 B2 * | 11/2004 | Grover et al. | 438/570 |
| 6,949,454 B2 * | 9/2005 | Swanson et al. | 438/570 |
| 2002/0025610 A1 | 2/2002 | Litwin et al. | |

\* cited by examiner

*Primary Examiner*—Hung Vu
(74) *Attorney, Agent, or Firm*—Slater & Matsil, L.L.P.

(57) ABSTRACT

An integrated circuit structure for isolating substrate noise and a method of forming the same are provided. In the preferred embodiment of the present invention, a semi-insulating region is formed using proton bombardment in a substrate between a first circuit region and a second circuit region. Two guard rings are formed along the semi-insulating region, each on a side. A backside semi-insulating region is formed through proton bombardment from the back surface of the substrate into the substrate. The backside semi-insulating region is preferably connected with the semi-insulating region. A grounded guard layer is preferably formed on the backside semi-insulating region.

14 Claims, 6 Drawing Sheets

METHOD AND STRUCTURE FOR ISOLATING SUBSTRATE NOISE

This application is a divisional of U.S. patent application Ser. No. 11/089,186 entitled "Method and Structure for Isolating Substrate Noise," filed Mar. 24, 2005, which claims the benefit of U.S. Provisional Application Ser. No. 60/611,186 entitled "Method and Structure for Isolating Substrate Noise," filed Sep. 17, 2004, which applications are incorporated herein by reference.

TECHNICAL FIELD

This invention relates generally to integrated circuit isolation, and particularly relates to noise isolation using guard ring and proton bombardment.

BACKGROUND

Recent advances in IC design and fabrication make possible the integration of digital and analog circuits on the same IC chip. This technology is widely used in mobile communication systems where a digital core is combined with analog RF circuits. The digital and analog circuits are typically formed as a variety of components near one surface of a wafer. These components may be at several levels separated by inter-metal dielectric layers. Usually, the topmost layer is made of a dielectric material and serves as a passivation layer for the entire structure.

The integration of the digital and analog circuits causes noise coupling between the digital and analog circuits. The analog circuit is especially affected by the noise generated in the digital circuit. This significantly limits the performance achieved in analog signal processing and data conversion circuits, such as differential amplifiers that are extremely sensitive to the noise at the differential inputs. FIG. 1 illustrates the noise path between the digital and analog circuits. Region 4 is a digital circuit. Region 6 is an analog circuit. Arrows 8, 10 and 12 symbolize one of the noise paths in the substrate 2.

Besides the noise interference between the digital circuit and analog circuit, noise interference also exists between the digital circuit components.

There is a significant dependence of the noise coupling through the substrate on the constitution of the silicon substrate. Therefore, various methods have been developed to break the noise path in the silicon substrate. One commonly used method is forming isolation layers in the substrate. As shown in FIG. 1, an isolation layer 14 breaks the noise path between circuit regions 4 and 6. Isolation layer 14 is typically formed of dielectric materials. One example of the isolation layer 14 is a trench isolation between the circuits to be isolated. To form deep trench isolation, trenches with near vertical sides are etched between the circuits and then filled with dielectric materials.

However, even deep trench isolation is not fully satisfactory when full isolation between the circuits is required. This is particularly true when high-speed analog circuits are involved.

Another known method is placing a guard ring in the substrate and between the circuits to be isolated. As illustrated in FIG. 2, a p+ guard ring 20 is formed in a p– substrate 2. The guard ring 20 is grounded as shown at 22; therefore, it creates a low resistivity path for the substrate noise. The noise is more likely to take the low resistivity path to the guard ring 20 than a higher resistivity path to another circuit region.

Yet another method has been developed. FIG. 3 illustrates a proton bombardment approach. Semi-insulating region 24 is created by proton bombardment from the topside of the substrate 2 between the circuits 4 and 6 to be isolated. The semi-insulating region 24 has resistivity of higher than about $10^5$ Ω-cm. Therefore, a high resistivity path is created between the circuits to isolate the noise. To further isolate the circuits, the substrate 2 is also bombarded from the backside, creating a semi-insulating region 26. When the semi-insulating region 24 created from the topside and the semi-insulating region 26 created from the backside of the circuit are connected, the noise path in the substrate is effectively isolated by high resistivity isolations.

The guard ring and proton bombardment are effective methods for noise isolation. However, when the size of the integrated circuit drops to 0.13 µm or lower, and the frequency increases to over about 1 GHz, the noise interference becomes more severe and better isolation techniques are needed.

SUMMARY OF THE INVENTION

The preferred embodiments of the present invention provide an integrated circuit structure for isolating substrate noise and a method of forming the same.

In accordance with one aspect of the present invention, a semi-insulating region is formed in a substrate between a first circuit region and a second circuit region by proton bombardment. Two guard rings are formed along the semi-insulating regions. A backside semi-insulating region is formed using proton bombardment from the back surface of the substrate. The backside semi-insulating region is preferably connected with the semi-insulating region created from topside. A grounded guard layer is then formed on the backside semi-insulating region.

The preferred embodiments of the present invention effectively isolate the substrate noise.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
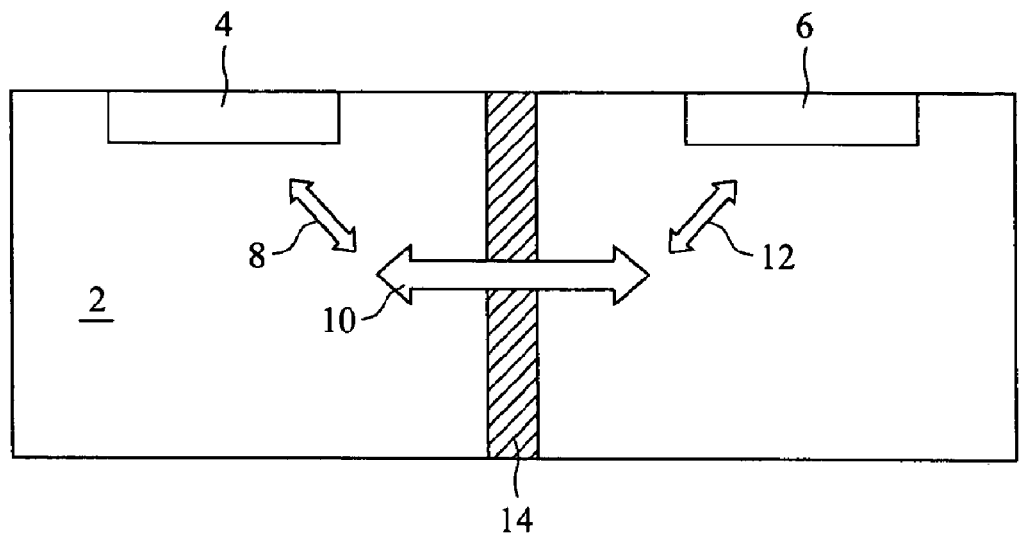
FIG. 1 illustrates a noise path in a substrate between a digital circuit region and an analog circuit region.
Figure 2:
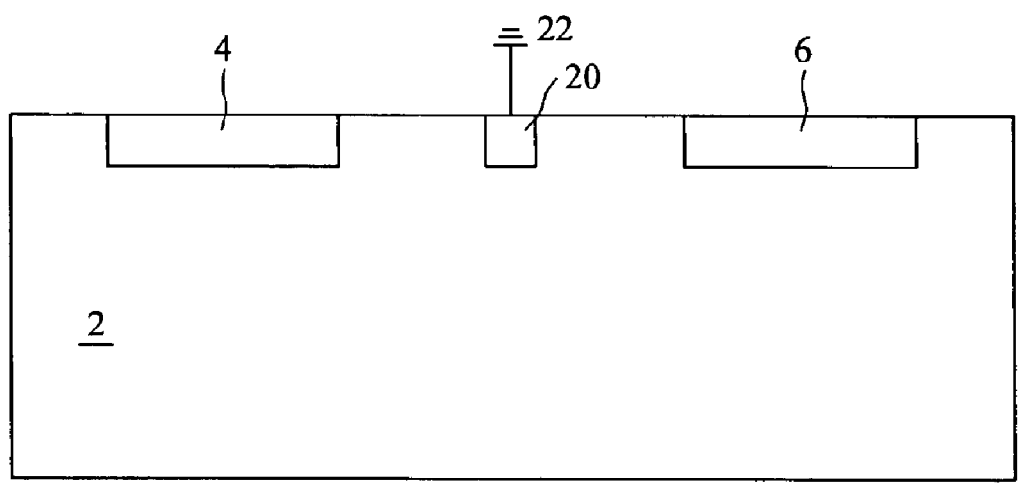
FIG. 2 illustrates a conventional method of forming a guard ring in a substrate to isolate the noise between a digital circuit region and an analog circuit region.
Figure 3:
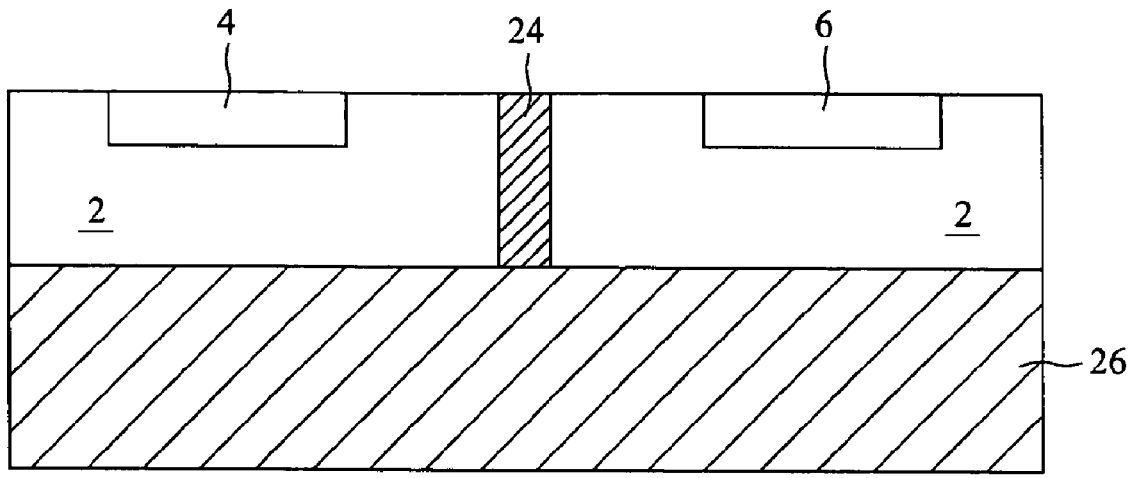
FIG. 3 illustrates a conventional method of using semi-insulating regions created by proton bombardment to isolate the noise between a digital circuit region and an analog circuit region.
Figure 4:
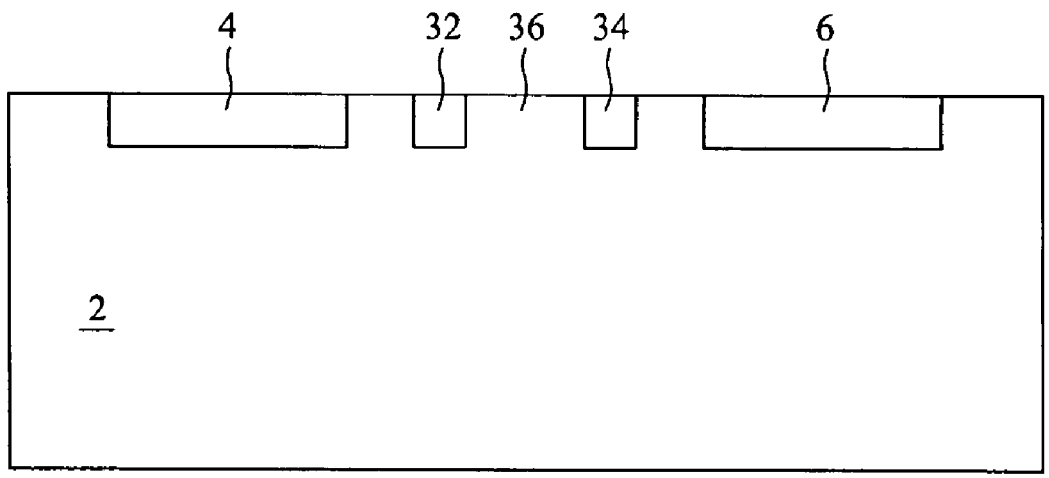
FIG. 4 illustrates the formation of a digital region, an analog region, and guard rings.

The preferred embodiments are illustrated in FIGS. 4 through 11 wherein like reference numbers are used to designate like elements throughout the various views and illustrative embodiments of the present invention. FIG. 4 illustrates a silicon substrate 2 having two circuit regions 4 and 6. Throughout the description of the preferred embodiments, region 4 is referred to as a digital circuit region and region 6 is referred to as an analog circuit region. However, in other embodiments, regions 4 and 6 can also be two digital regions, two analog regions or two compound regions that include both analog and digital circuits.

Topside guard rings 32 and 34 are formed in substrate 2. A space 36 is left between the topside guard rings 32 and 34 in order to form a topside semi-insulating region. In the preferred embodiment, there are two topside guard rings formed. The first guard ring 32 is formed along the topside semi-insulating region 36 on the first circuit region 4 side. The second guard ring 34 is formed along the topside semi-insulating region 36 on the second circuit region 6 side. The second guard ring 34 is substantially similar to the first guard ring 32. In other embodiments, only one guard ring 32 that is closer to the digital region 4 is formed. In yet other embodiments, a single guard ring may be formed closer to analog region 6. Preferably, the guard rings 32 and 34 are formed by implanting a p type impurity into a p– type substrate to form a p+ region, or implanting an n type impurity into an n– type substrate to form an n+ region. Preferably, the guard rings 32 and 34 are formed simultaneously with the source and drain region implantation and/or silicidation in the integrated circuit. The topside guard rings 32 and 34 may also be formed by methods such as forming recesses and growing highly doped silicon in the recesses, providing the source and drain regions are formed the same way. It is preferred that the guard rings 32 and 34 are formed using the same method used for forming other parts of the circuit so that there are fewer forming steps involved.

The guard rings 32 and 34 substantially extend from the top surface of the substrate 2 into the substrate. The guard rings 32 and 34 have a preferred depth of about 0.2 µm to about 0.4 µm and a width of greater than about 0.5 µm. They are preferably connected to the substrate 2. In the preferred embodiment, the guard rings 32 and 34 connect to a circuit ground pad through a metal/contact/substrate structure, which is known in the art.

Figure 5:
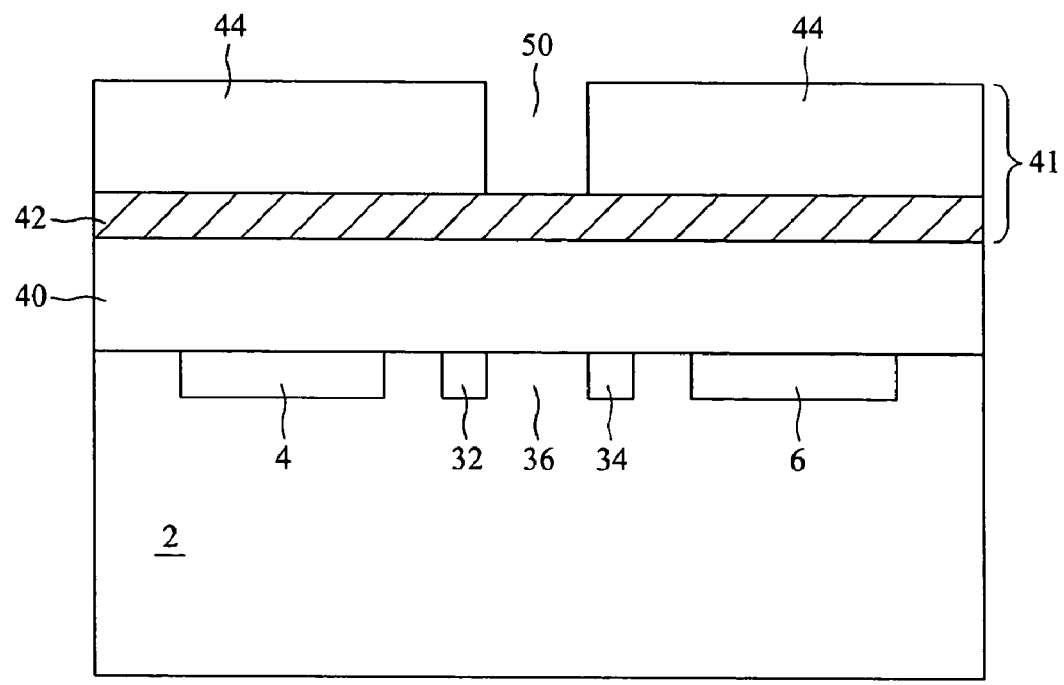
FIG. 5 illustrates the formation of a proton mask for a topside semi-insulating region.

FIG. 5 illustrates the formation of a proton mask 41 for forming the topside semi-insulating region 36. The proton mask 41 is formed over the digital region 4, the analog region 6 and the topside guard rings 32 and 34. It is to be noted that a semi-insulating region produced by proton bombardment is unstable over long periods if maintained at temperatures in excess of about 400° C., so it is preferable that the proton bombardment not be performed until the manufacture of the integrated circuit is substantially complete. Therefore, an inter-layer 40 typically exists between the proton mask 41 and the digital region 4 and circuit region 6 since the proton mask 41 is preferably formed at a point after the formation of the digital and analog regions and before packaging. The packaging temperature after forming the semi-insulating regions produced by proton bombardment is preferably less than 350° C. The inter-layer 40 represents multiple device layers that are not necessary for understanding the invention and may comprise PMD, CESL and/or other layers.

The proton mask 41 is preferably formed of a proton mask layer 44, which preferably comprises silicon or metal, on an adhesive layer 42. The adhesive layer 42 is used to bond the inter-layer 40 and the proton mask layer 44. In the preferred embodiment, the adhesion layer 42 is a photo resist. Although conventionally the proton mask layer 44 is formed of heavy metals, in the preferred embodiment of the present invention, silicon is preferred over metals since metals affect the characteristics of the underlying layers when metals are diffused. The adhesive layer 42 is preferably formed through a traditional lithography coating approach to a thickness of about 15 µm to about 30 µm. The proton mask layer 44 is preferably formed by depositing raw wafer material to a thickness of about 200 µm to about 600 µm, and more preferably about 300 µm to about 400 µm. The thickness of the proton mask layer 44 is related to the energy and proton current of the proton bombardment and it is desired that its thickness be enough to prevent the protons from penetrating and reaching the underlying layers. An opening 50 is formed in the proton mask layer 44, preferably by using dry etch, to expose the region 36 to proton bombardment. Photo resist 42 acts as an etching stop layer.

Figure 6:
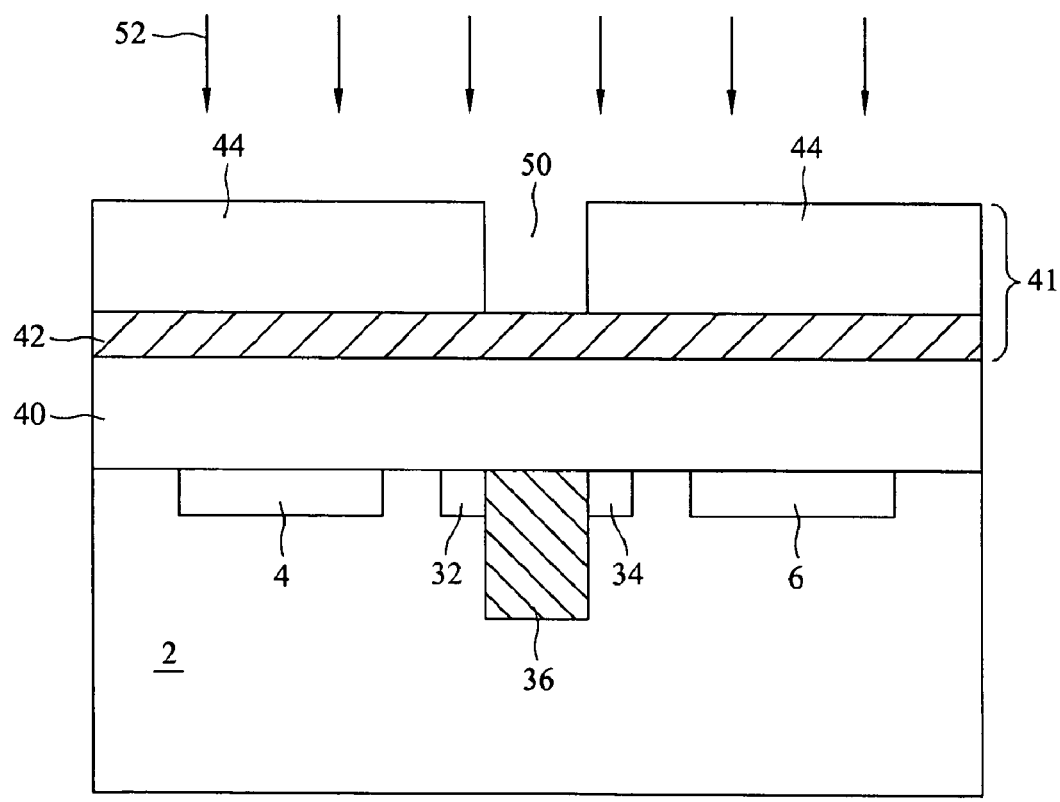
FIG. 6 illustrates proton bombardment to the topside of the substrate creating a semi-insulating region.

FIG. 6 illustrates a proton bombardment, which is symbolized by arrows 52, performed from the topside of substrate 2. Without the protection of the silicon proton mask layer 44, protons penetrate the photo resist 42 and inter-layer 40 and bombard region 36. The proton bombardment to the silicon region 36 destroys the lattice structure of the silicon substrate and forms amorphous silicon; therefore, the resistivity is increased. In a typical case, the resistivity of the region 36 is increased from about $10\ \Omega$-cm before proton bombardment to about $10^5\ \Omega$-cm after.

To prevent the protons from penetrating the proton mask layer 44 and destroying the underlying layers in regions not intended to be bombarded, the topside proton bombardment uses lower energy, preferably about 1 MeV to about 3 MeV. The topside semi-insulating region 36 substantially extends from the top surface of the substrate into the substrate. The depth of the resulting semi-insulating region 36 is preferably less than about 50 µm, and more preferably about 10 µm to about 50 µm. The width of the semi-insulating region 36 is preferably greater than 10 µm, and more preferably between about 30 µm to about 50 µm. The proton current is also preferably low, more preferably between about 5E14 protons/cm$^2$ and about 5E15 protons/cm$^2$. The proton mask 41 is then removed through a traditional photo resist stripping approach.

Figure 7:
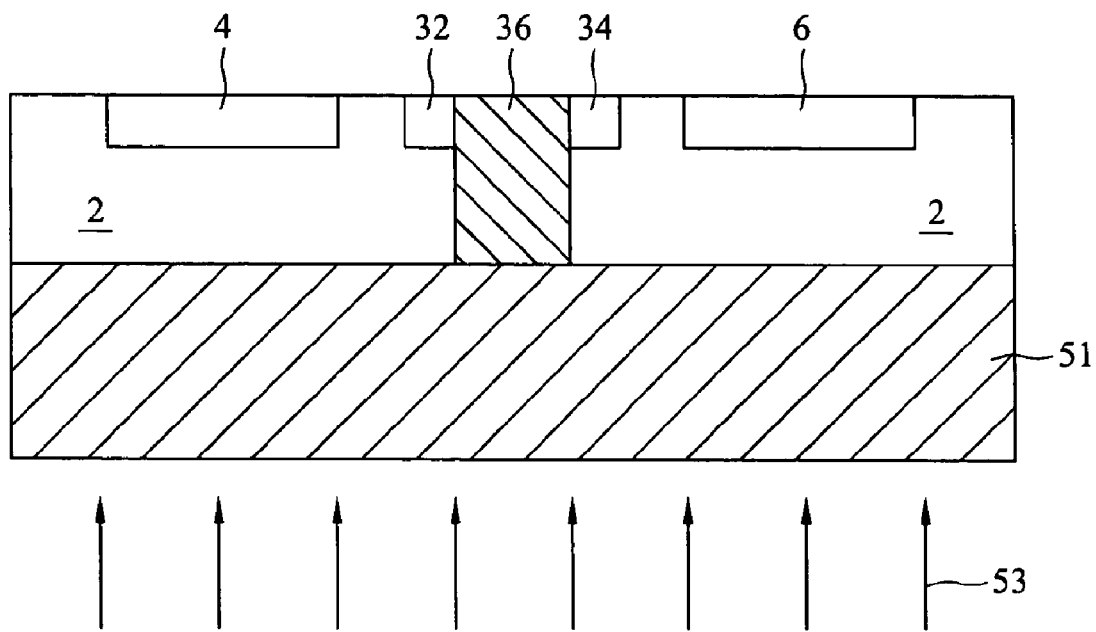
FIG. 7 illustrates a proton bombardment from the backside of the substrate.

A backside semi-insulating layer 51 is then formed at the backside of the substrate 2, as illustrated in FIG. 7. The backside of the substrate is blanket bombarded by protons. Arrows 53 symbolize the proton bombardment. The energy of the proton bombardment is preferably between about 10 MeV and about 20 MeV. The preferred proton current is about 5E15 protons/cm$^2$ to about 5E16 protons/cm$^2$. The backside semi-insulating region 51 substantially extends from the back surface of the substrate 2 into the substrate. Using these bombardment parameters, the thickness of the resulting semi-insulating region 51 is typically between about 200 µm to about 400 µm.

Better isolation is provided if the semi-insulating region 36 is connected to semi-insulating layer 51. Therefore, the depth of the semi-insulating layer 51 may be adjusted by adjusting the bombardment energy and the optimal energy can be determined according to the thickness of the wafer.

Figure 8:
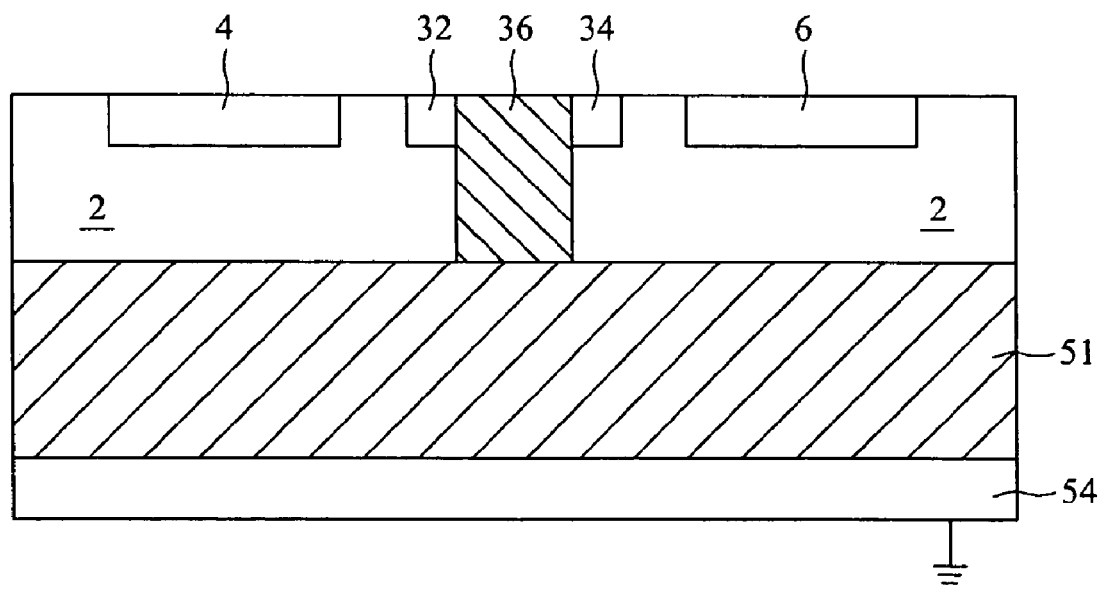
FIG. 8 illustrates a back side grounded guard layer formed on the backside of the substrate.

In one preferred embodiment, a backside guard layer 54 is formed on the semi-insulating layer 51, as illustrated in FIG. 8. The guard layer 54 is preferably grounded. The guard layer 54 preferably comprises a metal such as aluminum, aluminum-copper alloy, copper, copper alloy, gold, silver, iron, tin, and the like. In the preferred embodiment, the backside guard layer 54 is blanket sputtered to a desired thickness of about 200 μm to about 1000 μm, and more preferably about 200 μm to about 400 μm. In other embodiments, physical vapor deposition (PVD), plating, and plasma enhanced CVD (PECVD) can also be used. The backside guard layer 54 is preferably grounded for electrical isolation. In other embodiments, there is no backside guard layer 54 formed.

Figure 9:
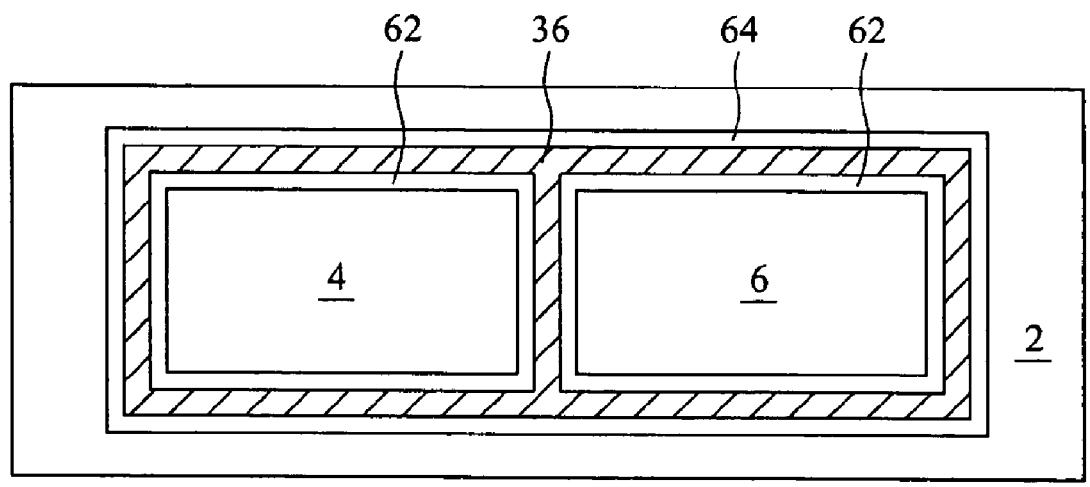
FIG. 9 illustrates a top view of a digital region, an analog region and the insulation regions.

Topside guard rings 32, 34 and semi-insulating region 36 are preferably formed surrounding the region to be isolated, although they can be formed as strips or other configurations. FIG. 9 illustrates a top view of a digital region 4 and an analog region 6 being isolated. Topside guard rings 62, 64 and semi-insulating region 36 enclose both digital region 4 and analog region 6. Considering that there is a semi-insulating region underneath the digital region 4 and analog region 6, digital region 4 and analog region 6 are each isolated in a well constructed of semi-insulating materials and guard rings.

Figure 10:
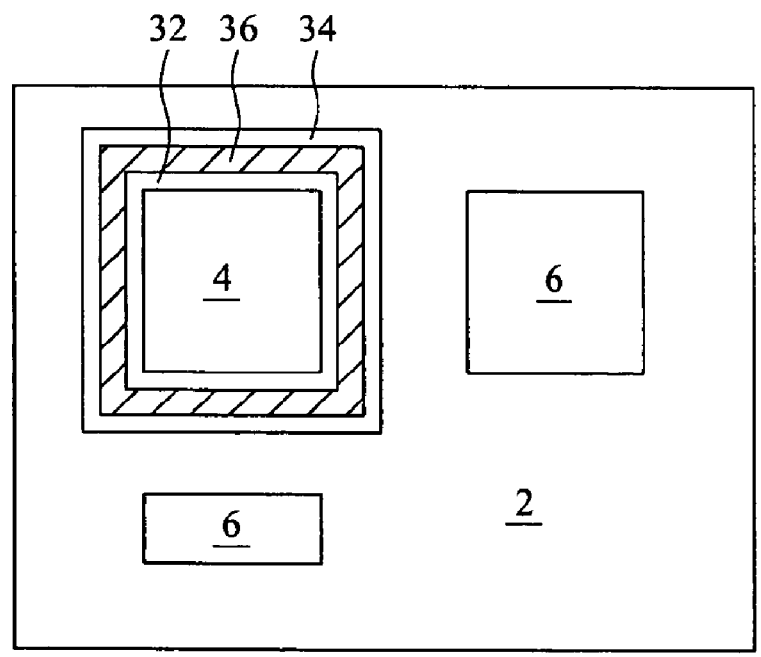
FIG. 10 illustrates a top view of a digital region and analog regions with only the digital region insulated.

The insulating scheme in FIG. 9 protects digital and analog circuits from both inside and outside noise sources. However, to have an insulating scheme like this, more space is needed. In a typical IC circuit with both digital and analog circuits, there may be one digital region and multiple analog regions. FIG. 10 illustrates another scheme protecting the analog circuits from the digital circuit noise. Digital circuit 4 is enclosed in a well formed of guard rings 32, 34 and semi-insulating region 36 and a semi-insulating layer (not shown) on the backside of the substrate 2, while the analog circuits 6 are placed outside of the well. The noise generated by the digital circuit is thus isolated inside.

Figure 11:
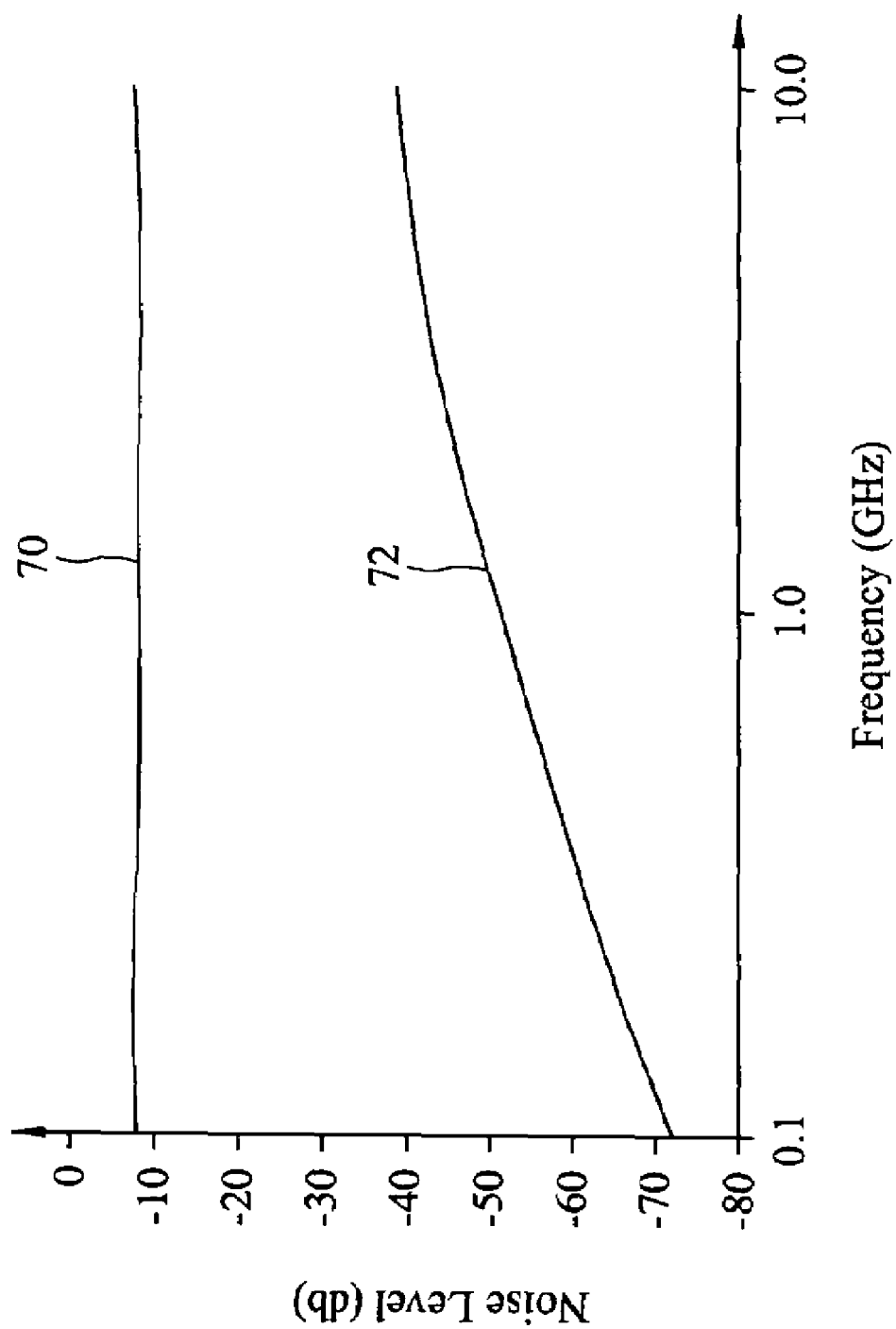
FIG. 11 illustrates noise levels as functions of frequency.

The preferred embodiments of the present invention provide effective noise isolation, particularly when the size of the integrated circuit drops to about 0.13 μm or lower, and the frequency increases to over about 1 GHz, since the noise interference becomes more severe and better isolation techniques are needed. FIG. 11 illustrates noise levels 70 and 72 as functions of frequency. Line 70 shows the noise level measured in a circuit with no noise isolation. A −10 db noise level is measured. Line 72 illustrates the noise measured using the present embodiment. At 0.1 GHz, the noise is about −70 db, at 1 GHz, the noise is about −50 db, and at 10 GHz, the noise is about −40 db. Therefore, the present embodiment has a noise reduction of about 60 db at 0.1 GHz and about 40 db at 1 GHz. As a comparison, by using a guard ring only, the noise reduction is about 20 db at 1 GHz, and by using proton bombardment only, the noise reduction is about 25 db at 1 GHz. Therefore, the preferred embodiments of the present invention have greatly improved the noise isolation between digital and analog regions in the integrated circuit.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of isolating noise in an integrated circuit, the method comprising:
   forming a first circuit region in a substrate;
   forming a second circuit region in the substrate;
   performing a first proton bombardment to form a first semi-insulating region between the first circuit region and the second circuit region, wherein the first semi-insulating region extends from a top surface of the substrate into the substrate;
   forming a first guard ring extending from the top surface of the substrate into the substrate, wherein the first guard ring is between the first and the second circuit region, and is adjacent the first semi-insulating region;
   performing a second proton bombardment to form a second semi-insulating region, wherein the second semi-insulating region extends from a surface of a backside of the substrate into the substrate; and
   forming a guard layer on the second semi-insulating region from the backside of the substrate.

2. The method of claim 1, wherein the first proton bombardment is performed with an energy of about 1 MeV to about 3 MeV.

3. The method of claim 1 further comprising forming a proton mask to shield the first circuit region, the second circuit region, and the first guard ring region from the first proton bombardment.

4. The method of claim 3, wherein the proton mask comprises a metal.

5. The method of claim 3, wherein the proton mask comprises silicon.

6. The method of claim 1, wherein the first guard ring adjoins the first semi-insulating region, wherein the method further comprises forming a second guard ring adjoining the first semi-insulating region, and wherein the second guard ring is on an opposite side of the first semi-insulating region than the first guard ring.

7. The method of claim 1, wherein the second proton bombardment is performed with an energy of about 10 MeV to about 20 MeV.

8. The method of claim 1 further comprising packaging the integrated circuit after the steps of forming the first and the second semi-insulating regions, the packaging being performed at a temperature of less than about 350° C.

9. The method of claim 1 further comprising grounding the first and second semi-insulating regions.

10. The method of claim 1 further comprising grounding the first guard ring.

11. The method of claim 1, wherein the first guard ring is along the first semi-insulating region, and is on a same side of the first semi-insulating region as the first circuit region.

12. The method of claim 11 further comprising forming a second guard ring along and adjoining the first semi-insulating region, wherein the second guard ring is on a same side of the first semi-insulating region as the second circuit region.

13. The method of claim 1 further comprising coupling the first guard ring to a circuit ground pad through a metal/contact/substrate structure.

14. A method for forming an integrated circuit structure, the method comprising:
   providing a substrate comprising a first circuit region and a second circuit region;
   forming a first semi-insulating region between the first circuit region and the second circuit region, wherein the first semi-insulating region extends from a top surface of the substrate into the substrate;
   forming a first guard ring along and adjoining the first semi-insulating region, wherein the first guard ring extends from the top surface of the substrate into the substrate;
   forming a second semi-insulating region extending from a surface of a backside of the substrate into the substrate, wherein the first semi-insulating region physically contacts the second semi-insulating region; and
   forming a guard layer on the second semi-insulating region from the backside of the substrate.

* * * * *